(12) United States Patent
Matuyama (10) Patent No.: US 6,340,908 B1
(45) Date of Patent: Jan. 22, 2002

(54) PHASE ADJUSTING CIRCUIT, SCALING SIGNAL GENERATION CIRCUIT USING PHASE ADJUSTING CIRCUIT, AND POSITION MEASURING APPARATUS USING SCALING SIGNAL GENERATION CIRCUIT

(75) Inventor: Yasuhiko Matuyama, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/553,531

(22) Filed: Apr. 20, 2000

(30) Foreign Application Priority Data

Apr. 21, 1999 (JP) ............................. 11-113239

(51) Int. Cl.[7] .................. H03H 11/16; H03H 31/00; H03H 5/13
(52) U.S. Cl. .................. 327/238; 327/246; 327/248; 327/255; 327/258
(58) Field of Search ................. 327/231–233, 327/237–238, 246, 247, 248, 249, 254, 255, 361, 258; 375/261

(56) References Cited

U.S. PATENT DOCUMENTS 4,718,018 A * 1/1988 Sloane et al. .............. 364/480
6,032,028 A * 2/2000 Dickey et al. .............. 455/110
6,054,883 A * 4/2000 Ishihara ..................... 327/255
6,181,199 B1 * 1/2001 Camp, Jr. et al. ........... 330/10

* cited by examiner

Primary Examiner—Terry D. Cunningham
Assistant Examiner—Quan Tra
(74) Attorney, Agent, or Firm—Frommer Lawrence & Haug LLP; William S. Frommer; Darren M. Simon (57) ABSTRACT

A phase adjusting circuit including an input level adjuster using two detection signals having different phases and adjusting an amplitude of at least one detection signal to a predetermined level and a signal processor for signal processing including at least one of addition and subtraction on the two detection signals after level adjustment to generate a pair of output signals having a phase difference of 90 degrees or a single output signal having a phase difference of 90 degrees with respect to one of the detection signals, and a position measuring apparatus including an output level adjuster, a scaling signal generator, a detector, an A/D converter, and a memory in addition, wherein the position measuring apparatus cancels a phase error so that a signal having a phase difference of 90 degrees can be obtained.

8 Claims, 8 Drawing Sheets

PHASE ADJUSTING CIRCUIT, SCALING SIGNAL GENERATION CIRCUIT USING PHASE ADJUSTING CIRCUIT, AND POSITION MEASURING APPARATUS USING SCALING SIGNAL GENERATION CIRCUIT

BACKGROUND OF THE INVENTION

1. Field of the Invention

The present invention relates to a phase adjusting circuit for precisely adjusting phases of two signals having different phases to a phase difference of 90 degrees. Further, the present invention relates to a scaling signal generation circuit for generating a scaling signal having a waveform of a cyclically repeated monotonous increase using the phase adjusting circuit and a position measuring apparatus using the same.

2. Description of the Related Art

As a method of detecting a position of a mobile unit, there is a method using cyclic signals having a phase difference of 90 degrees generated when the mobile unit is detected.

Figure 1:
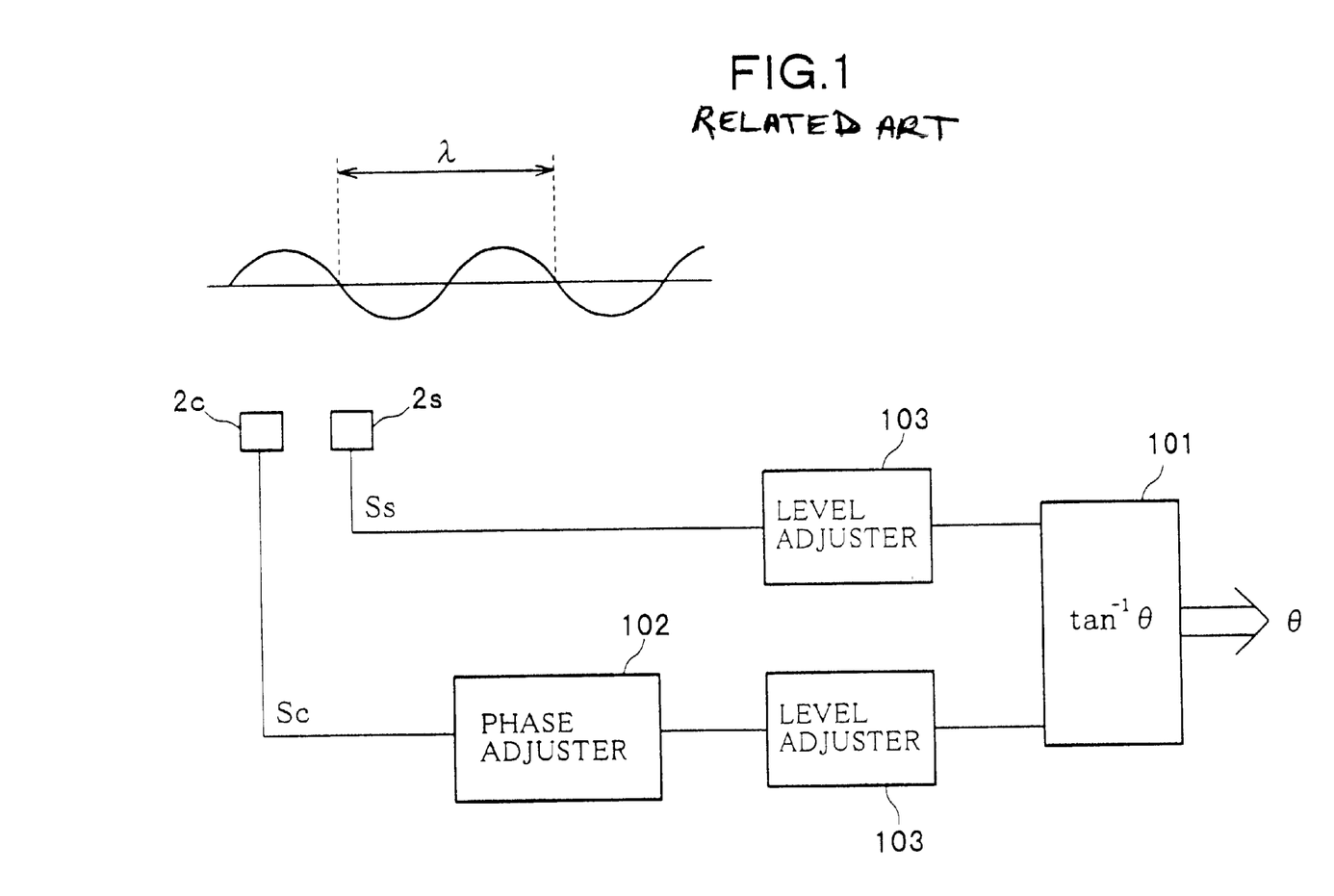
FIG. 1 is a block diagram of the configuration of key parts of a position measuring apparatus of the related art.

In this position detecting method, as shown in FIG. 1, sensors 2s and 2c for outputting cyclic signals which change as the mobile unit moves (herein after, referred to as "detection signals") are arranged at predetermined positions so that the phases of the detection signals become different by 90 degrees. Accordingly, two detection signals Ss and Sc ideally having the same amplitudes and a phase difference of 90 degrees are obtained from the two sensors 2s and 2c.

The two detection signals Ss and Sc having the same amplitudes and a phase difference of 90 degrees respectively become functions of the sin θ and cos θ (θ is a phase angle) when they are sine waves. The ratio of the two detection signals can be expressed in the form of a function of tan θ.

Since tan θ is a function cyclically repeating a monotonous increase along with an increase of the phase angle θ, it can be used as a scaling signal. For example, the phase angle can be detected from 0 to 2π from the value of tan θ and the signs of sin θ and cos θ. When equally dividing one period λ section on the θ-axis into N number of fine steps, a cyclic function expressed by tan θ monotonously increases in a cycle π for every fine step having a size of λ/n along with movement of a mobile unit, and a scaling signal is obtained for every period λ (2π) section by referring to the signs of sin θ and cos θ. Specifically, if a scaling signal generator 101 finds a function of tan θ from the ratio of two detection signals and calculates its inverse function $\tan^{-1} \theta$, a linear phase angle θ taking discrete values equally divided into fine steps is obtained and a scaling value x is calculated from the angle θ and the signs of sin θ and cos θ. By increasing the order every period, it becomes possible to measure a position over a long distance of movement.

When using a position measuring apparatus of such a measurement principle, in a reticle alignment mechanism of a stepper or other application used installed in a semiconductor manufacturing apparatus, the required precision and resolution are high. Further, these requirements have become severer every year.

As one means for realizing high precision measurement of position, generally, as shown in FIG. 1, a conventional position measuring apparatus requires, in addition to a scaling signal generator 101 for calculating the $\tan^{-1} \theta$ etc., a phase adjuster 102 for adjusting the phase to give the two detection signals a phase difference of exactly 90 degrees and, further, a level adjuster 103 for adjusting the amplitudes of the two signals.

In reality, however, there to no phase adjuster capable of adjusting the phase by an extremely high precision. Up until now, two sensors have been integrally formed by patterning on a substrate to improve the patterning precision at the time of formation and thereby secure the precision required for the phase difference.

On the other hand, to improve the resolution of position measurement, it is generally sufficient to increase the division number N in one period λ section.

To increase the division number N, it is necessary to increase the number of bits of the A/D converter. However, although an 8-bit or 10-bit A/D converter (IC) is available at a low price, an A/D converter of larger bits becomes expensive. Further, a 16-bit or higher A/D converter cannot be easily obtained at the present, so there is a practical limit to the increase of the number of bits of the A/D converter.

Accordingly, the number of bits of the A/D converter Is increased to a certain extent. A further higher resolution of position measurement is attained by making the period (signal period) λ of the detection signal shorter.

The resolution increases as the signal period λ becomes shorter, for example, when the division number N is 400, the resolution becomes 5 μm with a 2 mm λ, 1 μm with a 400 μm λ, and 0.1 μm with a 40 μm λ.

If shortening the signal period λ to increase the resolution, however, the relative positional precision between the sensors 2s and 2c becomes a problem. Namely, as explained above, the relative positions between the two sensors 2s and 2c depended on the patterning precision, but when the distance between the sensors 2s and 2c becomes shorter due to making the signal period λ shorter, the phase deviation due to patterning error increases in the signal period λ.

As a result, the positional precision of sensors required for accurately generating two detection signals having a 90 degree phase difference becomes stricter as the period of the detection signal becomes shorter. For example, in order to suppress the deviation of the phase difference of the sensors 2s and 2c to within 1 degree from 90 degrees, when the signal period λ it 4 mm, the required positional precision becomes 11 μm—still easy, while when the signal period λ is 400 μm, the positional precision becomes 1.1 μm, when the signal period λ is 40 μm, and the positional precision becomes 0.11 μm—which is very exacting. Furthermore, in actuality, since the positional deviation of a pattern must not exceed ½ of the resolution, a still stricter positional precision is required.

As explained above, in the position measuring apparatus of the related art, there is a trade-off between the resolution and the phase precision (positional precision of the sensors). Therefore, there has been the disadvantage that the resolution cannot be improved while maintaining a high phase precision.

SUMMARY OF THE INVENTION

An object of the present invention is to provide a phase adjusting circuit capable of providing a high phase precision regardless of the signal period, a scaling signal generation circuit, and a position measuring apparatus using the same.

According to a first aspect of the present invention, there is provided a phase adjusting circuit for adjusting phases of two input signals having different phases and generating a pair of signals having a phase difference of 90 degrees based on them, comprising an input level adjuster for adjusting at least one amplitude of said two input signals to a predetermined level; an adder for adding said two input signals after adjustment of the amplitude level and outputting a sum signal; and a subtractor for subtracting said two input signals after adjustment in amplitude level and outputting a difference signal having a phase of 90 degrees different from said sum signal.

Preferably, the circuit further comprises an output level adjuster for adjusting at least one of the amplitudes of said sum signal and said difference signal to predetermined level.

Preferably, said output level adjuster includes an amplifying circuit for amplifying a signal level of said sum signal or said difference signal.

According to a second aspect of the present invention, there is provided a phase adjusting circuit for adjusting phases of two input signals having different phases and generating a pair of signals having a phase difference of 90 degrees based on them, comprising an input level adjuster for adjusting the amplitude of at least one of said two input signals to a predetermined level and a subtractor for subtracting one input signal from the other input signal after level adjustment and outputting a difference signal having a phase difference of 90 degrees with respect to one of said input signals before level adjustment.

According to a third aspect of the present invention, there is provided a phase adjusting circuit for generating a pair of signals having a phase difference of 90 degrees based on two input signals having different phases, comprising an input level adjuster for adjusting the amplitude of at least one of said two input signals to a predetermined level and an adder for adding said input signals after level adjustment and outputting a sum signal having a phase difference of 90 degrees with respect to one of said input signals before level adjustment.

According to a fourth aspect of the present invention, there is provided a scaling signal generation circuit for generating a scaling signal having a waveform of a cyclically repeated monotonous increase based on two input signals having different phases, comprising an input level adjuster for adjusting the amplitude of at least one of said two input signals to a predetermined level; a signal processor for signal processing including calculation of at least one of addition and subtraction of said two input signals after level adjustment and generating a pair of output signals having a phase difference of 90 degrees or a single output signal having a phase difference of 90 degrees from one of said input signals; an output level adjuster for adjusting the amplitudes between said pair of output signals or between said one of input signals and said single output signal having a phase difference of 90 degrees to a predetermined level; and a scaling signal generator for generating said scaling signal based on a signal from said output level adjuster.

Preferably, said scaling signal generator receives as input two signals E·sin θ and E·cos θ adjusted in amplitude levels to E, where E is an adjusted amplitude, and having a phase difference of 90 degrees and finds an inverse function arctan θ of tan θ from the two signals so as to generate a variable θ (scaling signal) cyclically repeating a monotonous increase.

According to a fifth aspect of the present invention, there is provided a position measuring apparatus for measuring a position of a mobile unit without contact, comprising a detector arranged near said mobile unit for outputting two detection signals changing as said mobile unit moves and having different phases; an input level adjuster for adjusting the amplitude of at least one of said two detection signals to a predetermined level; and a signal processor for signal processing including at least one of addition and subtraction on said two detection signals after level adjustment and generating a pair of output signals having a phase difference of 90 degrees or a single output signal having a phase difference of 90 degrees with respect to one of said detection signals.

Preferably, the apparatus further comprises an A/D converter for conversion from an analog signal to a digital signal on signals having a phase difference of 90 degrees.

Further, the apparatus further comprises an output level adjuster for adjusting the amplitudes between said pair of output signals or between said one of detection signals and said single output signal having a phase difference of 90 degrees to a predetermined level, and a scaling signal generator for generating a scaling signal based on a signal from said output level adjuster; wherein said scaling signal is converted from an analog to digital format by said A/D converter.

Preferably, the apparatus comprises a memory for storing a digital signal after said A/D conversion.

More preferably, said memory stores said digital signal after the A/D conversion in memory cells in said memory addressed by using the two signals having a phase difference of 90 degrees input to said scaling signal generator.

In the phase adjusting circuit according to the present invention, when the pair of detection signals are input to the input level adjuster from for example the detector, the amplitude of at least one detection signal is adjusted to a predetermined level in the input level adjuster. Then, the signal processor performs signal processing including calculation of at least one of addition and subtraction on the pair of detection signals adjusted in amplitude levels.

When performing both addition and subtraction in the signal processing, the sum signal and the difference signal show a format of a sin θ function or a cosine function, and the phase difference of the two signals are completely to 90 degrees.

On the other hand, when performing addition or subtraction, both of a sine function term and a cosine function term appear in a formula developing the added result or the subtracted result by an addition theorem. In this case, in the level adjustment in the input level adjuster, for example, the amplitude of one of the detection signals Is adjusted to a predetermined level. At the time, the amplitude level of one detection signal is set to a value by which one of the sine function term and cosine function term is eliminated in later signal processing. As a result, the sum signal or the difference signal output from the signal processor becomes a signal having a phase exactly 90 degrees different from that of the other detection signal.

In such phase adjustment, the phase difference of the pair of signals after the phase adjustment does not change in accordance with the period length of the detection signals and always becomes 90 degrees.

The scaling signal generation circuit according to the present invention comprises an output level adjuster and a scaling signal generator in addition to the above phase adjusting circuit. The signals having a phase difference of 90 degrees output from the phase adjusting circuit are, after being adjusted in amplitude levels in the output level adjuster, input to the scaling signal generator. In the scaling signal generator, an inverse function of tan θ is obtained from the signals having a phase difference of 90 degrees and a scaling signal is obtained by using the same.

The position measuring apparatus according to the present invention comprises a detector, an A/D converter, memory, etc. in addition to the above scaling signal generation circuit. The scaling signal is input to the A/D converter where it is converted from an analog to digital format. The scaling signal after the A/D conversion (digital value) is stored in the memory in advance. Then, every time the detection signals change along with movement of the mobile unit, a digital value indicating a position of the mobile unit is output from the memory.

In the position measuring apparatus, a pair of signals having a phase difference of 90 degrees is obtained by signal processing. The phase difference does not change along with the period of the detection signals. Accordingly, it is possible to improve the resolution by shortening the wavelengths of the detection signals while maintaining a high phase precision.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 2:
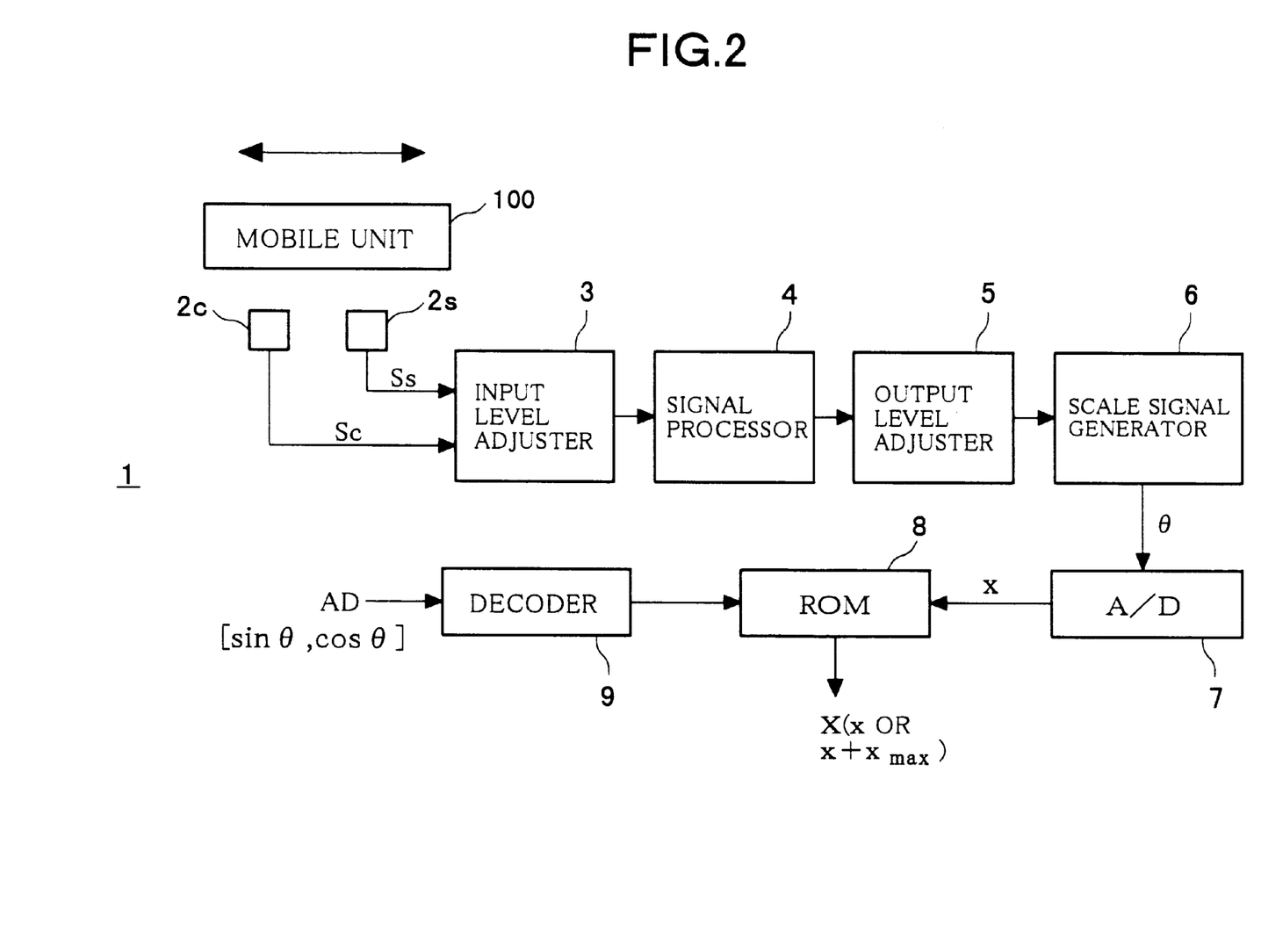
FIG. 2 is a block diagram of the configuration of key parts of a position measuring apparatus according to an embodiment of the present invention.

FIG. 2 is a block diagram of the configuration of key parts of a position measuring apparatus according to an embodiment of the present invention.

The position measuring apparatus 1 shown in FIG. 2 comprises sensors 2s and 2c, an input level adjuster 3, a signal processor 4, an output level adjuster 5, a scaling signal generator 6, an A/D converter 7, a memory (ROM) 8, and a decoder 9. Among them, the input level adjuster 3, the signal processor 4, and the output level adjuster 5 comprise the "phase adjusting circuit" according to the present invention.

The sensors 2s and 2c are detection elements provided near a mobile unit 100 and arranged at an interval so that the phase difference of the outputs become 90 degrees. The sensors 2s and 2c respectively output detection signals Ss and Sc having a phase difference of substantially 90 degrees by sine waves as the mobile unit 100 moves.

There are a variety of modes of the sensing.

For example, it is possible to provide a slit-type repeating pattern of transmittance and non-transmittance at the mobile unit 100 side and receive transmitted light by a light detection element when struck by light obliquely emitted from a not illustrated light source. At this time, every time a slit of a non-transmittance part blocks the light path, a detection signal which becomes a sine wave due to the moire phenomenon is output from the light detection element (sensor).

Also, by emitting laser light etc. to a receding or approaching mobile unit 100, the reflected light may be detected by the light detection element (sensor) at two positions giving a phase difference of 90 degrees.

Furthermore, a magnetic material such as ferrite may be provided at the mobile unit 100 side, the magnetic material repeatedly magnetized with a north pole and south pole in advance at a fine pitch, and rotation of the magnetic field changing along with the movement of the mobile unit 100 detected by a magneto-resistance element, Hall element, etc. For example, in the case of a magneto-resistance element, when a predetermined voltage is applied across the two ends of a magnetic thin film arranged folded in two different directions, a sine wave is obtained from the middle in accordance with the rotation of the magnetic field. In that case, the relative positions of two magneto-resistance elements are adjusted to set the phase difference of the outputs thereof.

Note that in all of the above sensing methods, two sensors (light reception elements, magnetic sensors, etc.) are ordinarily formed all at once by patterning on the same substrate. When the wavelengths of the two detection signals are $\lambda$, the relative positions of the sensors are determined in advance so that the phase difference becomes $m\lambda+90$ degree (m: 0 or a positive integer).

Note that there are a few cases where the phase difference becomes just 90 degrees, and some phase error arises due to the patterning precision.

The signal processor 4 performs predetermined processing including addition and/or subtraction based on the two detection signals Ss and Sc to cancel the error component caused by the above patterning precision from the detection signals.

The amplitudes of the two detection signals Ss and Sc are adjusted before and after the signal processing in the input level adjuster 3 and the output level adjuster 5.

The scaling signal generator 6 takes the ratio of the two detection signals Ss and Sc, which are functions of $\sin \theta$ and $\cos \theta$, to make a $\tan \theta$ function, then calculates an inverse function $\tan^{-1} \theta$ of $\tan \theta$ and outputs an analog value $\theta$ indicating the phase angle of the detection signals.

The A/D converter 7 divides a predetermined reference voltage by a predetermined number of bits in correspondence with the phase angle $\theta$. Therefore, a digital value x of a predetermined number of bits in a one-to-one correspondence with the angle $\theta$ is output from the A/D converter 7.

The digital value x is addressed and written in the ROM 8. The address in the ROM 8 is determined specifically by a set of [$\sin \theta$, $\cos \theta$]. In the write operation, x and $x+x_{max}$ are stored at different addresses for the same angle $\theta$ in accordance with the signs of $\sin \theta$ and $\cos \theta$. When an address signal AD with upper bits indicating the $\sin \theta$ and lower bits indicating the $\cos \theta$ is input to the decoder 9, a corresponding digital value x is output from the ROM 8. The digital value X (x or $x+x_{max}$) is output after being converted to an analog value by a not illustrated D/A converter etc. in accordance with need.

Figure 3:
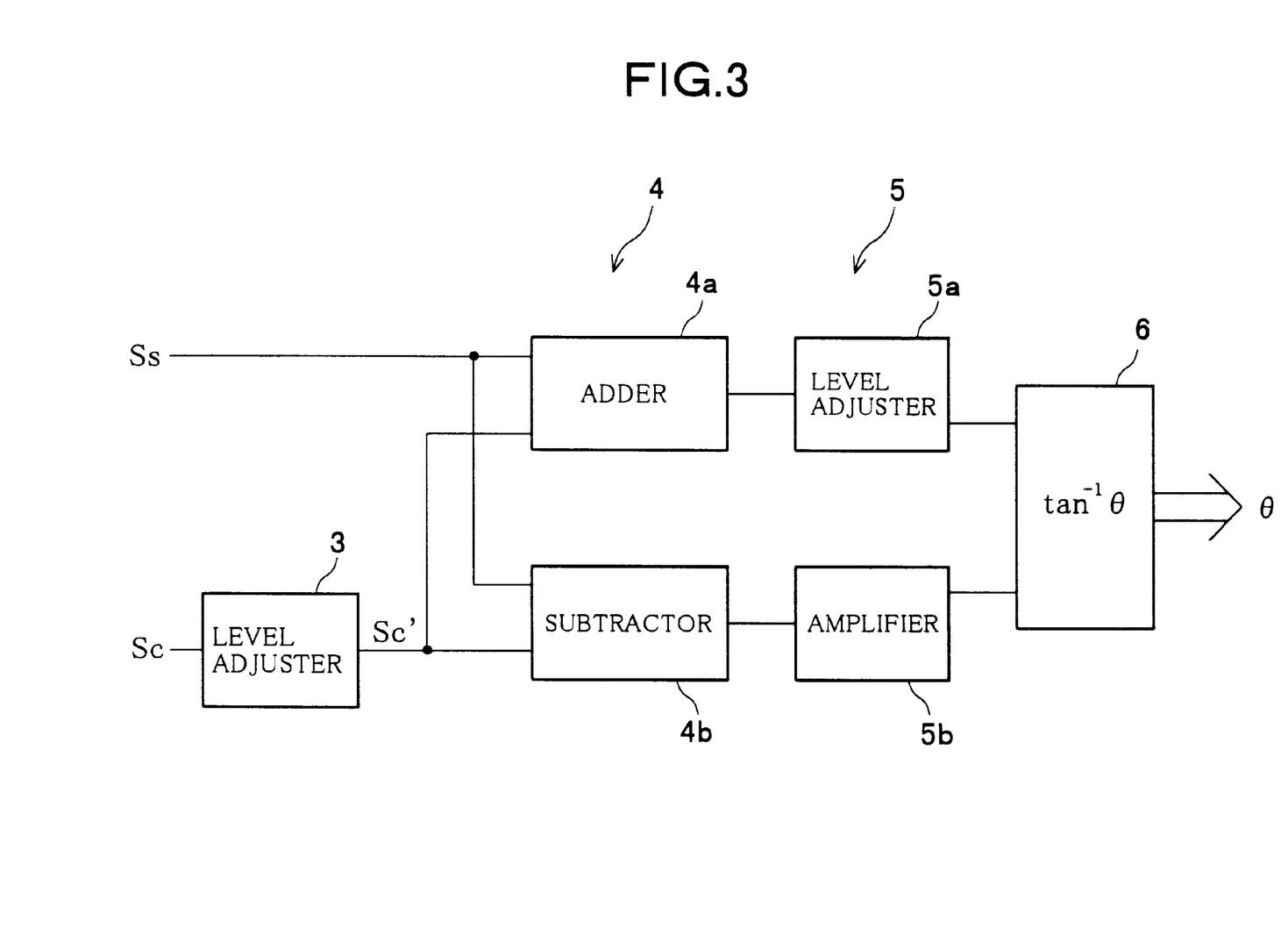
FIG. 3 is a block diagram of a specific example of the configuration of a phase adjusting circuit and a scaling signal generator, according to a first embodiment.

FIG. 3 shows a specific example of the configuration of a phase adjusting circuit according to a first embodiment shown with a scaling signal generator. Note that the portion shown in FIG. 3 corresponds to an embodiment of a "scaling signal generation circuit" according to the present invention.

The input level adjuster 3 in this example is comprised by a level adjusting circuit connected to the input path of one of the detection signals, for example, the detection signal Sc.

Figure 4:
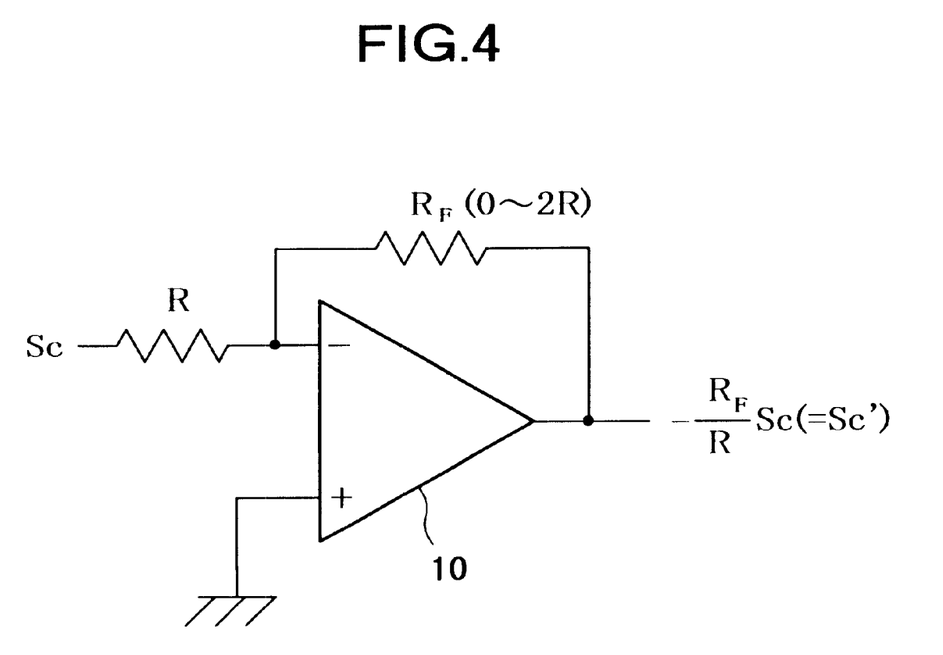
FIG. 4 is a circuit diagram of an example of the configuration of a level adjusting circuit.

The level adjusting circuit 3 can be comprised for example by an operational amplification circuit shown in FIG. 4.

In the operational amplification circuit, a non-inverted input (+) of an operational amplifier 10 is grounded and the detection signal Sc is input to the inverted input (−) via a resistor R. Also, a feedback resistor $R_F$ is connected between the inverted input (−) and output of the operational amplifier 10. As a result, $-(R_F/R)Sc$ Is output from the output of the operational amplifier 10.

Figure 5A:
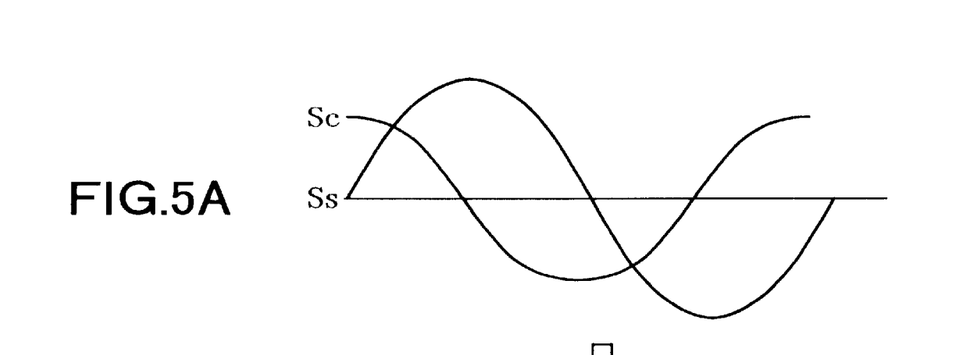
FIG. 5 is a view of the waveform of an example of an input/output signal of the level adjusting circuit.
Figure 5B:
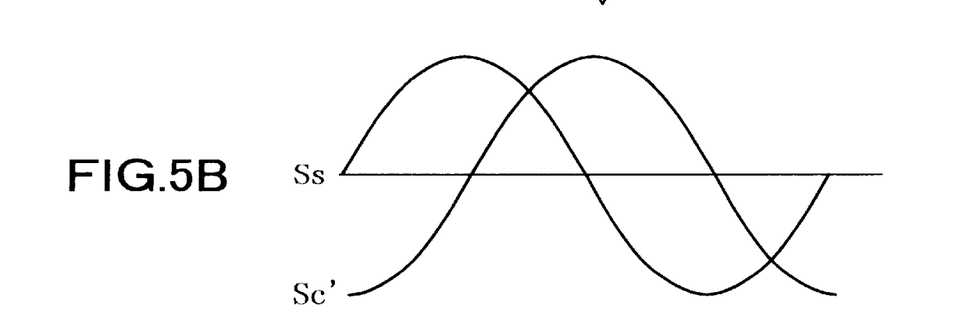

Now, as shown in FIG. 5A, assume that the original detection signal Sc has a phase advanced by 90 degrees and smaller amplitude compared with the other detection signal Ss. In this case, a detection signal Sc' output from the operational amplifier 10 is, as shown in FIG. 5B, shaped to a signal having a phase delayed by 90 degrees from the detection signal Ss and having the same amplitude. Actual adjustment of the amplitude is attained for example by making the feedback resistance $R_F$ a variable resistor and adjusting the variable resistor while monitoring the waveform of the detection signal Sc' by an oscilloscope etc.

The signal processor 4 in this example is comprised by an adder 4a for adding the detection signal Ss and Sc' and a subtractor 4b for subtracting one from the other.

Generally, the added result of sine wave signals sin α, sin β having the same amplitude is expressed by the next formula (1), and the subtracted result is expressed by the next formula (2).

$$\sin \alpha + \sin \beta = 2 \sin [(\alpha+\beta)/2] \cdot \cos [(\alpha-\beta)/2] \quad (1)$$

$$\sin \alpha - \sin \beta = 2 \cos [(\alpha+\beta)/2] \cdot \sin [(\alpha-\beta)/2] \quad (2)$$

Now, suppose that the detection signal Ss corresponds to sin β and the detection signal Sc' corresponds to sin α. From the positional relationship of the two sensors 2s and 2c, β=α+90+φ (φ: phase deviation component) stands. Therefore, (α−β)/2 becomes a certain phase value of (45+φ/2) and a constant.

Accordingly, the above formulas (1) and (2) can be respectively rewritten as the formulas (3) and (4) below:

$$\sin \alpha + \sin \beta = 2 \ C \cdot \sin [\alpha+45+\phi/2] \quad (3)$$

where, C=cos [45+φ/2]

$$\sin \alpha - \sin \beta = 2 \ S \cdot \cos [\alpha+45+\phi/2] \quad (4)$$

where, S=sin[45+φ/2]

Now, assume θ=α+45+φ/2 and the amplitudes of the two detection signals after adjustment of the gain are E. From the above formulas (3) and (4), E·sin θ to output from the adder 4a in FIG. 3 and E·cos θ to output from the subtractor 4b. Namely, in the first embodiment, the phase deviation component φ is completely canceled by addition and subtraction and signals having a phase difference of 90 degrees are generated.

Then, the two signals E·sin θ and E·cos θ are amplified In the output level adjuster 5. The output level adjuster may be configured provided with two amplifiers of the same amplification degrees, but the output level adjuster 5 In the first embodiment Is comprised by one connected amplifier 5b and a level adjusting circuit 5a for adjusting the amplitude to the amplified signal. The level adjusting circuit 5a is configured by a similar circuit to the one In FIG. 4. It is possible to adjust the variable resistor $R_F$ while monitoring the waveform by an oscilloscope etc. to completely adjust the amplitudes of the two signals.

The scaling signal generator 6 calculates the tan θ from the gain adjusted signals to generate an analog value θ of a cyclically repeated monotonous increase from the inverse function $\tan^{-1} \theta$.

Next, as shown in FIG. 2, the value is converted from an analog to digital format, written in the ROM, and read in accordance with input of an address signal AD.

In the position measuring apparatus according to the first embodiment, the phase deviation component caused by patterning error of the sensors 2s and 2c can be canceled by just addition and subtraction of the two detection signals Ss and Sc. Accordingly, even when shortening the period λ of the detection signals Ss and Sc to raise the resolution and a time deviation caused by the patterning error of the sensors in the signal period becomes relatively larger, the precision of position measurement is not affected. As a result, high resolution and high precision position measurement becomes possible.

Also, since amplitude adjustment alone is sufficient, there are few portions to be adjusted. Further, since one of the two signals is adjusted to the amplitude of the other while monitoring it by an oscilloscope etc., amplitude adjustment can be performed accurately even if there are manufacturing variations in circuits.

Second Embodiment

Figure 6:
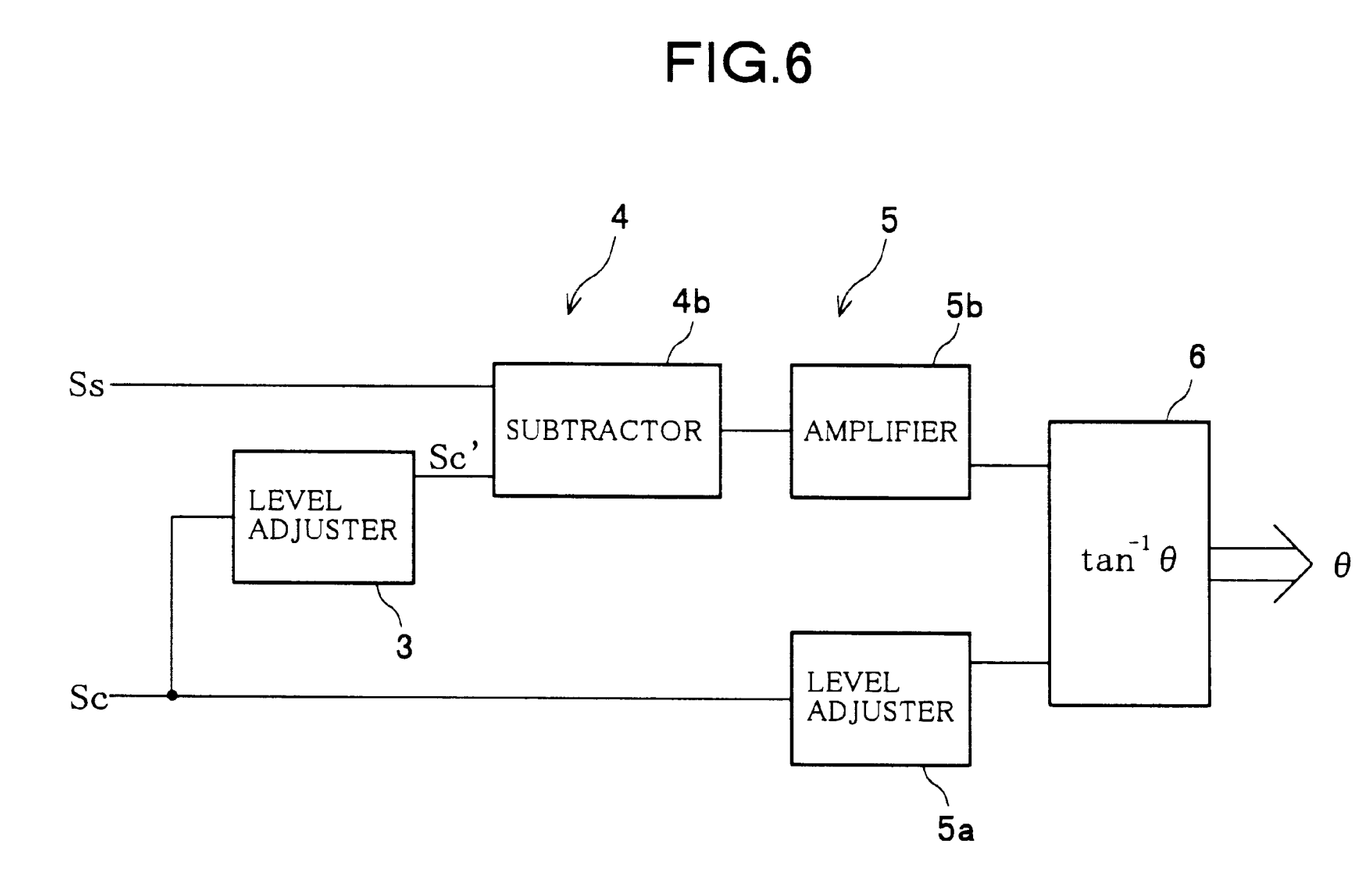
FIG. 6 is a block diagram of a phase adjusting circuit and a scaling signal generation circuit according to a second embodiment.

FIG. 6 shows a phase adjusting circuit according to a second embodiment along with a scaling signal generator.

In the phase adjusting circuit of the second embodiment, the signal processor 4 is comprised by only a subtractor 4b. Namely, the detection signal Ss is input to one input of the subtractor 4b, while the detection signal Sc' is input to the other input after being adjusted in gain in the level adjusting circuit 3.

With this circuit configuration, the detection signal S is A·sin(θ+φ) and the detection signal Sc' is B·cos θ (A, B: any constants). The detection signal Ss serving as a reference can be rewritten by the addition theorem to formula (5) below:

$$A \cdot \sin(\theta+\phi) = A(\sin \theta \cos \phi + \cos \theta \sin \phi) \quad (5)$$

Since the coefficient A·sin φ of cos θ is a constant, when the amplitude B of the detection signal Sc is made A·sin φ by gain adjustment, the second term of the above formula (5) is eliminated by subtraction, then A·cos φ•sin θ is obtained from an output from the subtractor 4b. Here, when A·cos φ is made E, the output of the subtractor 4b finally becomes E·sin θ.

Next, in the same way as in the first embodiment, the level adjusting circuit 5a and the amplifier 5b are used to amplify one of the output signal E·sin θ of the subtractor 4b and the detection signal Sc and adjust the other to the amplified amplitude. Due to this, two signals having the same amplitude and a phase difference of 90 degrees are obtained and a scaling signal θ is obtained by the calculation of $\tan^{-1} \theta$.

In the phase adjusting circuit according to the second embodiment, the same effects as in the first embodiment can be obtained using a signal processor having a simplified circuit configuration comprising only a subtractor.

Third Embodiment

In the second embodiment, the sine function side was used as a reference. In the third embodiment, the cosine function side is used as a reference.

Figure 7:
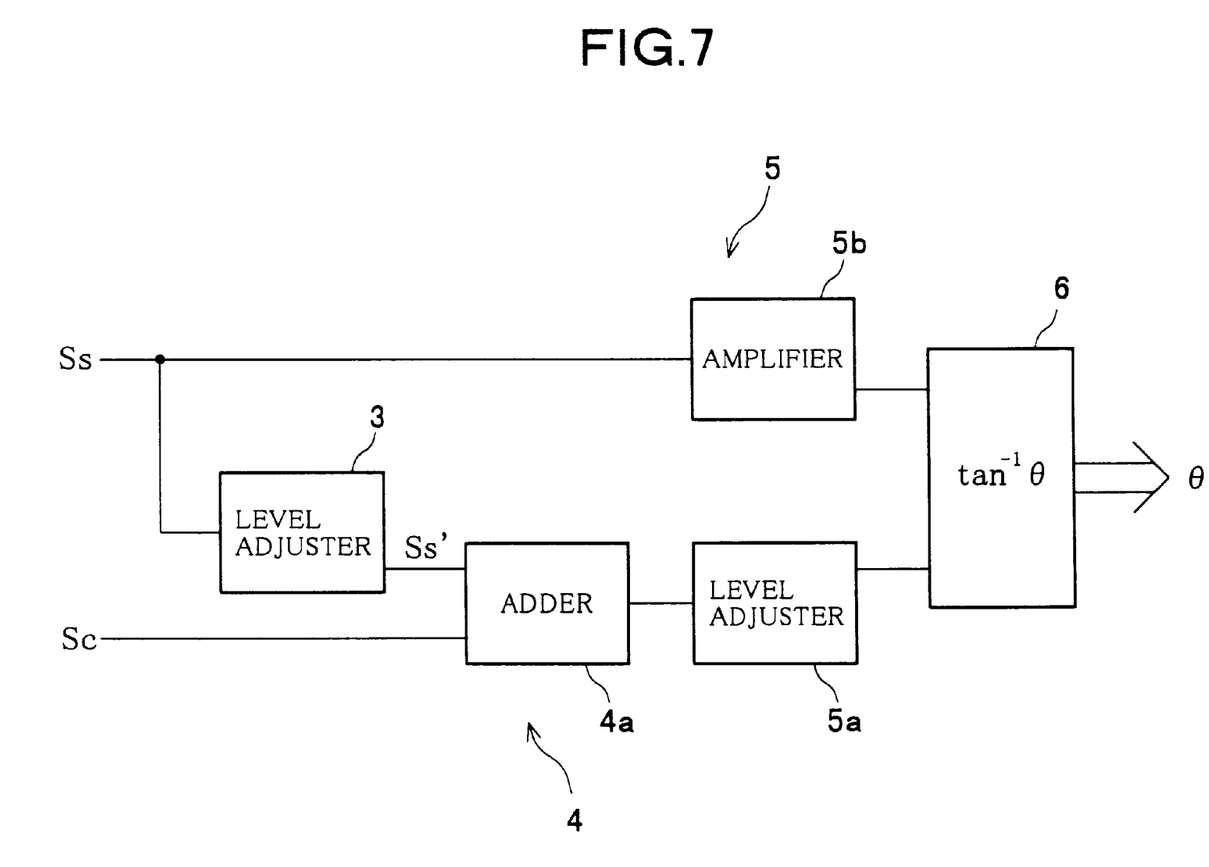
FIG. 7 is a block diagram of a phase adjusting circuit and a scaling signal generation circuit, according to a third embodiment.

When the detection signal Ss' after gain adjustment is A·sin θ and the detection signal Sc is B·cos(θ+φ) (A, B: any constants), the detection signal Sc can be expressed by the next formula (6) from the addition theorem:

$$B \cdot \cos(\theta+\phi) = B(\cos\theta\cos\phi - \sin\theta\sin\phi) \quad (6)$$

To eliminate the second term of formula (6), it is sufficient to multiply the detection signal Ss' with (sin φ·B/A) and add the result.

Accordingly, the phase adjusting circuit according to the third embodiment becomes as shown in FIG. 7. Namely, an adder 4a is provided on the detection signal Sc side and the gain adjusted detection signal Ss' is added to the detection signal Sc. Here, when assuming B·cos φ is E, the output of the adder 4a becomes E·cos θ.

Next, in the same way as in the first and second embodiment, the level adjusting circuit 5a and amplifier 5b are used to amplify one of the output signal E·cos θ from the adder 4a and the detection signal Ss and adjust the other to the amplified amplitude. Due to this, two signals having the same amplitudes and phases different by 90 degrees are obtained and a scaling signal θ is obtained by calculating $\tan^{-1}\theta$.

In the phase adjusting circuit according to the third embodiment, similar effects can be obtained as in the first embodiment by using a signal processor with a simplified configuration comprised of only an adder.

Note that a variety of modifications can be made to the above first to third embodiments.

For example, in the first embodiment, if the output amplitudes of the adder and the subtractor are adjusted by sufficiently large values, the output level adjuster 5 can be omitted. Also, the level adjusting circuit 3 serving as an Input level adjuster may be connected to any of the two detection signals. In the first to third embodiments, the level adjusting circuit 5a and the amplifier 5b serving as an output level adjuster may be freely switched.

Further, in FIG. 2, the A/D conversion can be realized by a comparator using the output from the signal processor 4.

FIG. 8 is a waveform diagram of the principle of A/D conversion by the comparator.

Figure 8A:
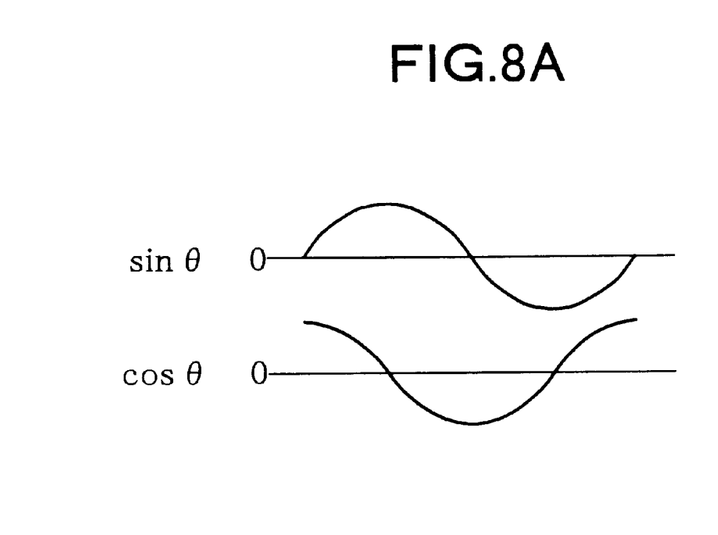
FIG. 8 Is a view of a signal waveform showing the principle of A/D conversion by a comparator.
Figure 8B:
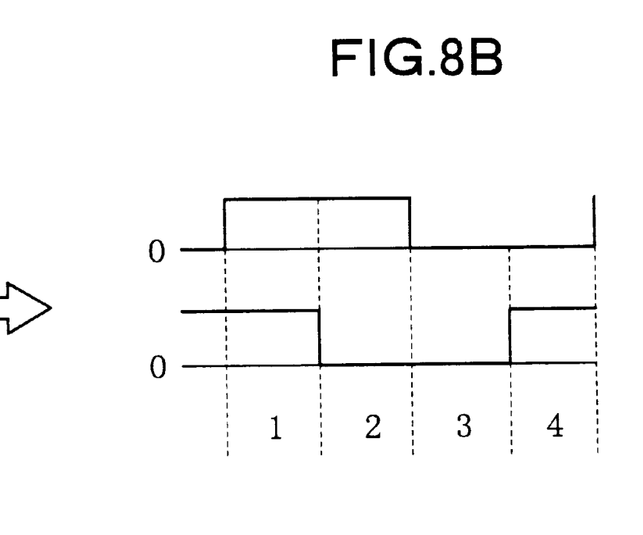

When comparing the phase of the two signals having the phase difference of 90 degrees shown in FIG. 8A by the x-axis (0 level), a two-bit digital signal waveform shown in FIG. 8B can be obtained. Further, when further comparing them by of a level of |sin θ|=|cos θ|, a 3-bit digital signal obtained by dividing the sections of "1" to "4" of FIG. 8B at their mid-points can be obtained. Similarly, it is possible to increase the number of bits of a digital signal.

Also, in FIG. 2, since the period of the scaling signal θ is π, the address signal is made [sin θ, cos θ] in order to obtain a digital value X of 2π. Other than that, for example, a flag for identifying 0 to π and π to 2π may be output from an output of the A/D conversion.

Note that the configuration and address format of the memory (ROM 8) are not limited to those illustrated in the figures.

According to the present invention, it is possible to provide a phase adjusting circuit capable of obtaining high phase precision regardless of the signal period and a scaling signal generation circuit and a position measuring apparatus using the same.

In the position measuring apparatus, it is possible to improve the resolution by shortening the period of a detection signal without sacrificing the measurement precision.

Also, an easy-to-use position measuring apparatus capable of precise amplitude adjustment can be realized.

While the invention has been described with reference to specific embodiment chosen for purpose of illustration, it should be apparent that numerous modifications could be made thereto by those skilled in the art without departing from the basic concept and scope of the invention.

What is claimed is:

1. A phase adjusting circuit for adjusting phases of two input signals having different phases and generating a pair of signals having a phase difference of 90 degrees based on the adjusted input signals, comprising:

an input level adjuster for adjusting the amplitude of at least one of said two input signals to a predetermined level and a subtractor for subtracting one input signal from the other input signal after level adjustment and outputting a difference signal having a phase difference of 90 degrees with respect to one of said input signals before level adjustment.

2. A phase adjusting circuit for adjusting phases of two input signals having different phases and generating a pair of signals having a phase difference of 90 degrees based on them, comprising:

an input level adjuster for adjusting the amplitude of at least one of said two input signals to a predetermined level and an adder for adding said input signals after level adjustment and outputting a sum signal having a phase difference of 90 degrees with respect to one of said input signals before level adjustment.

3. A scaling signal generation circuit for generating a scaling signal having a waveform of a cyclically repeated monotonous increase based on two input signals having different phases, comprising:

an input level adjuster for adjusting the amplitude of one of said two input signals to equal the amplitude of the other said input signal;

a signal processor for signal processing including calculation of one of addition and subtraction of said two input signals after level adjustment and generating a pair of output signals having a phase difference of 90 degrees;

an output level adjuster for adjusting the amplitudes of said pair of output signals to be equal; and a scaling signal generator for generating said scaling signal based on the adjusted pair of signals from said output level adjuster.

4. A scaling signal generation circuit as set forth in claim 3, wherein said scaling signal generator receives as input two signals E·sin θ and E·cos θ adjusted in amplitude levels to E, where E is an adjusted amplitude, and having a phase difference of 90 degrees and finds an inverse function arctan of tan θ from the two signals so as to generate a variable θ (scaling signal) cyclically repeating a monotonous increase.

5. A position measuring apparatus for measuring a position of a mobile unit without contact, comprising:

two detectors for detecting said mobile unit and for outputting two detection signals changing as said mobile unit moves and having different phases;

an input level adjuster for adjusting the amplitude of one of said two detection signals to equal the amplitude of the other said detection signal;

a signal processor for signal processing including one of addition and subtraction on said two detection signals after level adjustment and generating a pair of output signals having a phase difference of 90 degrees;

an output level adjuster for adjusting the amplitudes between said pair of output signals to a predetermined level; and a scaling signal generator for generating a scaling signal based on the adjusted pair of output signals.

6. A position measuring apparatus as set forth in claim 5, further comprising an A/D converter for converting said scaling signal to a digital signal.

7. A position measuring apparatus as set forth in claim 6, further comprising a memory for storing said digital signal.

8. A position measuring apparatus as set forth in claim 7, wherein a memory address for storing said digital signal in said memory is determined on the basis of the adjusted pair of output signals.

* * * * *